United States Patent
Ogane et al.

(10) Patent No.: US 8,779,723 B2
(45) Date of Patent: Jul. 15, 2014

(54) BATTERY CHARGE/DISCHARGE CONTROL APPARATUS

(75) Inventors: Takashi Ogane, Wako (JP); Naoki Maruno, Wako (JP); Tsuyoshi Matsuda, Wako (JP); Yuji Fujita, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 425 days.

(21) Appl. No.: 13/379,980

(22) PCT Filed: Jun. 1, 2010

(86) PCT No.: PCT/JP2010/059264
§ 371 (c)(1),
(2), (4) Date: Dec. 21, 2011

(87) PCT Pub. No.: WO2010/150625
PCT Pub. Date: Dec. 29, 2010

(65) Prior Publication Data
US 2012/0098497 A1    Apr. 26, 2012

(30) Foreign Application Priority Data
Jun. 25, 2009 (JP) .................... 2009-151670

(51) Int. Cl.
*H02J 7/00* (2006.01)
(52) U.S. Cl.
USPC .......................... 320/134; 320/104; 320/150
(58) Field of Classification Search
CPC .......... H02J 2007/004; Y02T 10/7044; H01M 10/443; G01R 31/3679; B60W 10/26; B60W 20/106; B60W 2510/246; B60W 2530/14
USPC ......................... 320/104, 134, 150
See application file for complete search history.

(56) References Cited

U.S. PATENT DOCUMENTS

| | | | | |
|---|---|---|---|---|
| 7,078,877 B2* | 7/2006 | Salasoo et al. | | 320/104 |
| 7,545,109 B2* | 6/2009 | Salman et al. | | 318/139 |

FOREIGN PATENT DOCUMENTS

JP    10-174297 A    6/1998
(Continued)

OTHER PUBLICATIONS

Office Action, Chinese Patent Application No. 201080026288.X dated Jul. 3, 2013.

*Primary Examiner* — Edward Tso
*Assistant Examiner* — Aaron Piggush
(74) *Attorney, Agent, or Firm* — Arent Fox LLP

(57) ABSTRACT

A battery charge/discharge control apparatus for a vehicle capable of driving an electric motor by a battery is provided. Temperature of the battery is detected, temperature history distribution of the battery after start of temperature detection is calculated, and a lifetime workload of the battery is calculated on the basis of this temperature history distribution of the battery. A permissible value of a workload increase rate indicating a workload to increase per unit distance is calculated on the basis of the lifetime workload of the battery and a travel distance of the vehicle. An actual workload increase rate of the battery is compared with the permissible value of the workload increase rate. In the case where the actual workload increase rate is larger than the permissible value of the workload increase rate, an output is restricted from the output of the battery restricted in a normal driving mode if necessary by a restricted value based upon a difference between the actual workload increase rate and the permissible value of the workload increase rate. This makes it possible to carry out lifetime prolonging control for the battery more accurately by setting up an appropriate charge/discharge permissible amount in accordance with temperature change of the battery in the past.

12 Claims, 12 Drawing Sheets

(56) References Cited

FOREIGN PATENT DOCUMENTS

| JP | 10-340741 A | 12/1998 |
| JP | 1415500 A | 5/2003 |
| JP | 1634723 A | 7/2005 |
| JP | 2006-101674 A | 4/2006 |
| JP | 2006-197765 A | 7/2006 |
| JP | 1945345 A | 4/2007 |
| JP | 2009-190690 | 8/2009 |

* cited by examiner

US 8,779,723 B2

BATTERY CHARGE/DISCHARGE CONTROL APPARATUS

CROSS-REFERENCE TO RELATED APPLICATIONS

This application is a National Stage entry of International Application No. PCT/JP2010/059264, filed Jun. 1, 2010, which claims priority to Japanese Patent Application No. 2009-151670 filed Jun. 25, 2009, the disclosure of the prior application of each of which is incorporated in its entirety by reference.

TECHNICAL FIELD

The present invention relates to a battery charge/discharge control apparatus for controlling charge/discharge of a battery to supply electric power to an electric motor for driving a vehicle, and more specifically, the present invention relates to a battery charge/discharge control apparatus for controlling output and regeneration of the battery in accordance with a battery workload with respect to a travel distance of the vehicle.

BACKGROUND ART

Heretofore, there is a vehicle that mounts thereon a power train, which uses two kinds of power sources including a gasoline or diesel engine that is an internal combustion and an electric motor. Such a power train is called as a hybrid system. This electric motor is driven by electric power supplied from a high voltage battery mounted on the vehicle. For example, in the case where an AC motor is used as the electric motor, DC power outputted from the battery is converted to AC power by means of a circuit such as an inverter or the like, and the electric motor is driven by this AC power.

Since a battery in such a hybrid system is responsible for driving of a vehicle, reliability thereof is to be heightened. Further, since output characteristics of such a battery largely depends upon its usage state (such as a travel distance, a driving method of a driver, frequency of use of accessories such as an air conditioner and a car stereo system), it is difficult to determine a deteriorated state of the battery using only elapsed years from the beginning of use.

As the system that determines a deteriorated state of a battery and carries out control so as to inhibit deterioration of the battery in a predetermined case, a battery control apparatus for a car has been known (see Japanese Patent Application Publication No. 2007-323999 (hereinafter, referred to as "Patent Literature 1"), for example). In a battery control apparatus of Patent Literature 1, a rate of deterioration of a battery is calculated every predetermined time on the basis of voltage, an electric current and temperature of a battery, and a control to inhibit (or reduce) deterioration of the battery (change of a target SOC, restriction of a charge/discharge amount of the battery, and the like) is carried out in accordance with a comparison result between the calculated rate of deterioration and a reference rate of deterioration.

Namely, Patent Literature 1 discloses, in order to calculate a rate of deterioration, which is a deterioration level of a battery, that is, a charge state quantity (SOC: State of Charge), a resistance deterioration calculating method in which internal resistance (impedance) of the battery is detected and its growth rate is used, and a current capacity deterioration calculating method in which a current capacity is detected and a decreasing rate of its change rate is used. Further, Patent Literature 1 also discloses, as a method of detecting a current capacity, a method of calculating a remaining capacity SOCv on the basis of open voltage by an estimate value of battery open voltage and a method of calculating a remaining capacity SOCc on the basis of electric current accumulation.

SUMMARY OF THE INVENTION

Problems to be Solved by the Invention

Now, in the resistance deterioration calculating method disclosed in Patent Literature 1, impedance measurement subject to a moving average value of an electric current per unit of time and temperature using an equivalent circuit model of the battery is carried out to create an impedance table. Open voltage is acquired from actually measured terminal voltage and an electric current, and the remaining capacity SOCv is acquired on the basis of an estimate value of the open voltage by means of map data or the like.

Further, in the current capacity deterioration calculating method disclosed in Patent Literature 1, an initial value of a remaining capacity is acquired using a table from open voltage at start of a system, the remaining capacity SOCc is acquired by subtracting a consumption capacity based upon a value of integral of the product of the electric current and the battery efficiency and the current capacity of the battery acquired from a current capacity table from the initial value of the remaining capacity.

Thus, since the plurality of tables are used and the estimate is carried out in the battery control apparatus disclosed in Patent Literature 1, there has been a problem that the method of acquiring the remaining capacity SOC of the battery becomes complicated and this leads to increase in the memory capacity of the system and/or increase in the processing capability.

The present invention is made in view of the above points, and it is an object of the present invention to provide a battery charge/discharge control apparatus that can acquire a deterioration level of a battery on the basis of distribution of temperature history of the battery in the past and an actual workload increase rate of the battery with respect to temperature of the battery, and restrict an output of the battery if necessary.

Means for Solving the Problem

In order to solve the problem described above, according to the present invention, there is provided a battery charge/discharge control apparatus (10) or a vehicle (1) capable of driving an electric motor (3) by means of a battery (20), the apparatus including: a temperature detecting section (101) for detecting temperature of the battery (20); a temperature history distribution calculating section (14) for calculating temperature history distribution of the battery (20) since the temperature detecting section (101) starts to detect the temperature; a lifetime workload calculating section (15) for calculating a lifetime workload of the battery (20) on the basis of the temperature history distribution of the battery (20) calculated by the temperature history distribution calculating section (14); a travel distance detecting section (13) for detecting a travel distance of the vehicle (1); a workload increase rate permissible value calculating section (16) for calculating a permissible value of a workload increase rate on the basis of a lifetime workload of the battery (20) calculated by the lifetime workload calculating section (15) and the travel distance detected by the travel distance detecting section (13), the permissible value indicating a workload to increase per unit distance; an actual workload increase rate calculating section (12) for calculating an actual workload increase rate of the battery (20); a comparing section (17) for comparing the permissible value of the workload increase rate calculated by the workload increase rate permissible value calculating section (16) with the actual workload increase rate of the battery (20) calculated by the actual workload increase rate calculating section (12); and a battery output restricting section (18) for further restricting the output from the output of the battery (20) restricted in a normal driving mode if necessary by a restricted value based upon a difference between the actual workload increase rate and the permissible value of the workload increase rate in the case where the comparing section (17) determines that the actual workload increase rate is larger than the permissible value of the workload increase rate.

By configuring it in this manner, whether the output of the battery is restricted in accordance with the temperature history distribution of the battery or not is controlled. Therefore, it is possible to simplify a control logic thereof compared with a conventional method. Further, it is possible to carry out lifetime prolonging control for the battery more accurately by setting up an appropriate charge/discharge permissible amount in accordance with temperature change of the battery in the past.

In the battery charge/discharge control apparatus according to the present invention, the temperature detecting section (101) may detect the temperature of the battery (20) every predetermined timing from start to stop of the vehicle (1), and the temperature history distribution calculating section (14) may calculate, as the temperature history distribution, distribution of temperature history detected in a period of time from the start of the vehicle (1) to the latest detection time point by the temperature detecting section (101).

Alternatively, in the battery charge/discharge control apparatus according to the present invention, the temperature detecting section (101) may detect the temperature of the battery (20) every predetermined timing from start to stop of the vehicle (1), and the temperature history distribution calculating section (14) may calculate, as the temperature history distribution, distribution of temperature history detected in a period of time from the time when the vehicle (1) has been started for the first time to the latest detection time point by the temperature detecting section (101).

In the battery charge/discharge control apparatus according to the present invention, the output of the battery (20) may be controlled so as to be decreased in accordance with elapsed time since the vehicle (1) was started.

In the battery charge/discharge control apparatus according to the present invention, the battery output restricting section (18) may be configured so as to gradually change the output of the battery (20) in accordance with the restricted value.

In the battery charge/discharge control apparatus according to the present invention, charge to the battery (20) may also be restricted while the battery output restricting section (18) restricts the output of the battery (20). Therefore, it is possible to reduce a load of the battery in a predetermined case even in the case of both an output (discharge) of the battery and an input (charge) of the battery, and this makes it possible to prolong lifetime of the battery.

In this regard, reference numerals in parenthesis described above exemplify, for reference, corresponding components of embodiments (will be described later).

Advantageous Effects of the Invention

According to the present invention, it is possible to provide a battery charge/discharge control apparatus that can simplify a control logic of whether an output of a battery is restricted in accordance with temperature history distribution of the battery and can carry out lifetime prolonging control for the battery more accurately by setting up an appropriate charge/discharge permissible amount in accordance with temperature change of the battery in the past compared with a conventional method.

DETAILED DESCRIPTION OF THE INVENTION

Hereinafter, preferred embodiments of a battery charge/discharge control apparatus according to the present invention will be described in detail with reference to the appending drawings. A battery charge/discharge control apparatus according to the present invention is applied to a vehicle, such as an electric car or a hybrid car, on which a high voltage battery for driving the vehicle is mounted, for example, and is realized by an electronic control unit (ECU: Electronic Control Unit) mounted on the vehicle for controlling the whole vehicle, a battery ECU for controlling a high voltage battery or the like. The following embodiments will be explained as the case where the electronic control unit controls an engine and also controls a battery and an electric motor.

First Embodiment

Figure 1:
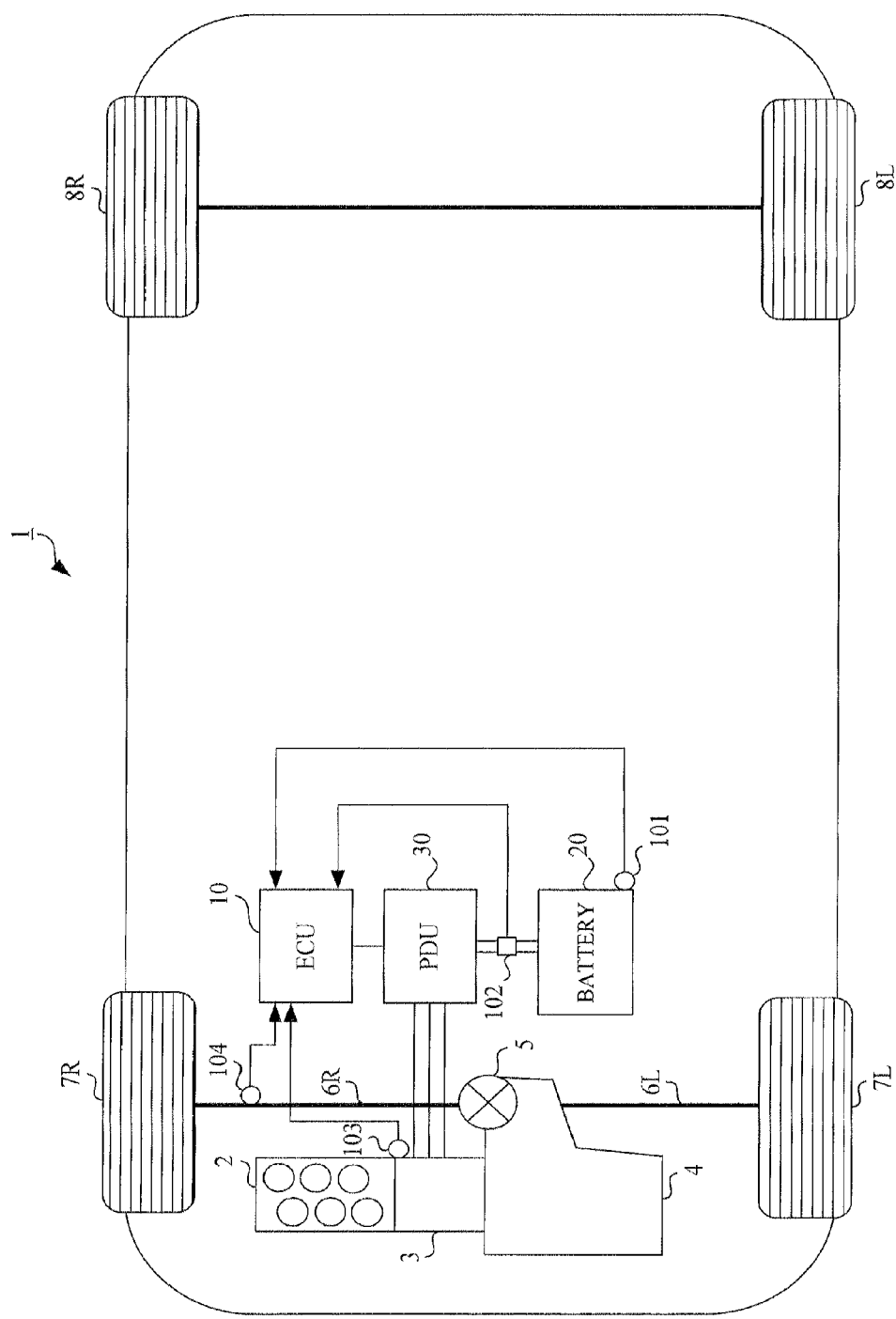
FIG. 1 is a block diagram schematically showing a power transmission system and a control system of a vehicle.

A configuration of a vehicle according to a first embodiment will first be described. FIG. 1 is a block diagram schematically showing a power transmission system and a control system of a vehicle. As shown in FIG. 1, a vehicle 1 according to the present embodiment is a so-called hybrid vehicle, and includes: an engine 2; an electric motor (motor) 3 disposed on an output shaft of this engine 2 and directly connected to the engine 2; a transmission (transmission) 4 connected to the output shaft of the engine 2 and the electric motor 3; a differential mechanism 5 connected to an output shaft of the transmission 4; right and left front wheels 7R, 7L, which are drive wheels, connected to this differential mechanism 5 via right and left axle shafts 6R, 6L; and right and left rear wheels 8R, 8L that are driven wheels.

Further, the vehicle 1 also includes: an electronic control unit ("ECU: Electronic Control Unit") 10 for controlling the engine 2 and the electric motor 3; a high voltage battery 20 that supplies electric power to the electric motor 3 and is charged by means of driving (energy of movement) of the electric motor 3 at regeneration; and a power drive unit (hereinafter, referred to as "PDU") 30 for controlling the electric motor 3.

As shown in FIG. 1, the electric motor 3 is connected to the PDU 30, and the PDU 30 is connected to each of the electronic control unit 10 and the battery 20. In response to instructions from the electronic control unit 10, the PDU 30 supplies electric power to the electric motor 3 from the battery 20 (discharge of the battery 20), and supplies electric power to the battery 20 from the electric motor 3 (charge of the battery 20).

A temperature sensor 101 for detecting temperature of the battery 20 is provided in the vicinity of the battery 20. An electric current and voltage sensor 102 for detecting an electric current and voltage of the battery 20 at charge and discharge of the battery 20 is provided between the battery 20 and the PDU 30. Detected data of the temperature sensor 101 and the electric current and voltage sensor 102 are outputted to the electronic control unit 10.

Further, an electric motor rotation sensor 103 for detecting the number of revolutions of the electric motor 3 is provided in the vicinity of the electric motor 3, and rotation sensors 104 for detecting the number of revolutions of the respective axle shafts 6R, 6L are provided in the vicinity of the right and left axle shafts 6R, 6L (in FIG. 1, only the rotation sensor 104 at the right front wheel 7R side is shown). Detected data of the electric motor rotation sensor 103 and the rotation sensor 104 are outputted to the electronic control unit 10.

In this regard, although illustration thereof is omitted, a rotation sensor for detecting the number of revolutions of the output shaft of the engine 2; an engine cooling water temperature sensor for detecting temperature of cooling water for the engine 2; a vehicle speed sensor for detecting vehicle speed of the vehicle 1; a hydraulic pressure sensor and an oil temperature sensor for a hydraulic pressure control apparatus (not shown in the drawings) for controlling the transmission 4 and the differential mechanism 5, and the like are provided in order to control driving of the engine 2. Further, the transmission 4 may be a transmission with multiple gears or a transmission with no gear, and may further be an automatic transmission (automatic transmission) or a manual transmission (manual transmission).

Here, a relationship between temperature and electric resistance of the battery 20 will be described. When cell temperature of the battery 20 rises during discharge or charge of the battery 20, a chemical reaction rate is improved, and an output of the battery 20 is increased. However, deterioration reactions of the battery 20, such as negative electrode alloy corrosion and positive electrode corrosion, are promoted within the battery 20. Deterioration of the battery 20 depends upon temperature of the battery 20 as shown in Arrhenius equation shown below.

$$k = Ae^{-Ea/RT}$$ [Formula 1]

Here, "k" denotes a reaction rate constant; "Ea" denotes activation energy; "R" denotes a gas constant; and "T" denotes absolute temperature. Therefore, in the present invention, it is controlled so that, in the case where temperature history of the battery 20 is biased to a high temperature side, a lifetime of the battery 20 is prolonged to at least a target travel distance (will be described later) by restricting the output of the battery 20.

Figure 2:
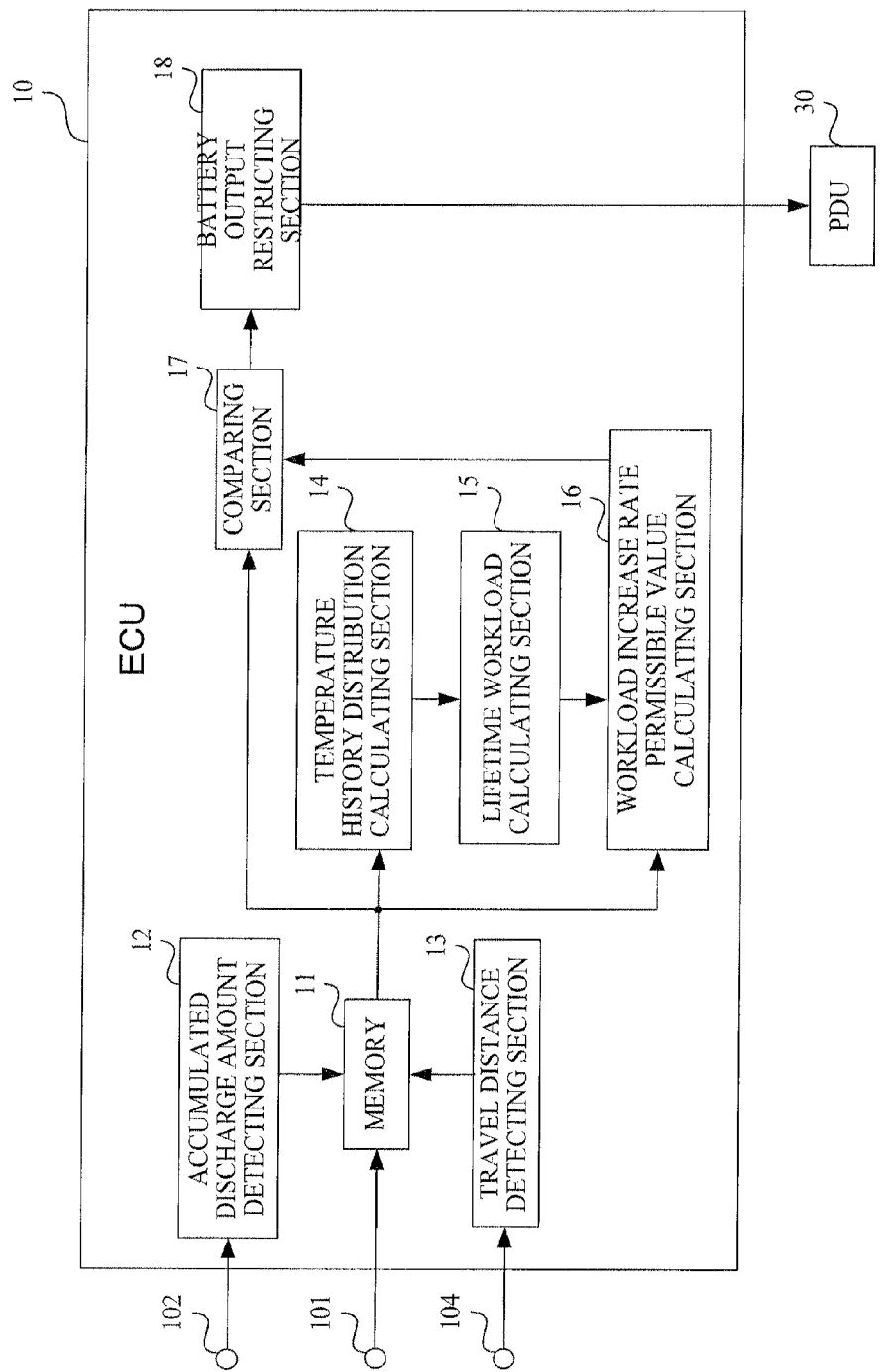
FIG. 2 is a block diagram showing functions of an electronic control unit shown in FIG. 1 according to the present invention.

Next, a configuration of the electronic control unit 10 according to the present embodiment will be described. FIG. 2 is a block diagram showing functions of the electronic control unit shown in FIG. 1 according to the present invention. As shown in FIG. 2, the electronic control unit 10 includes a memory 11, an accumulated discharge amount detecting section 12, a travel distance detecting section 13, a temperature history distribution calculating section 14, a lifetime workload calculating section 15, a workload increase rate permissible value calculating section 16, a comparing section 17 and a battery output restricting section 18.

Figures 3A, 3B:
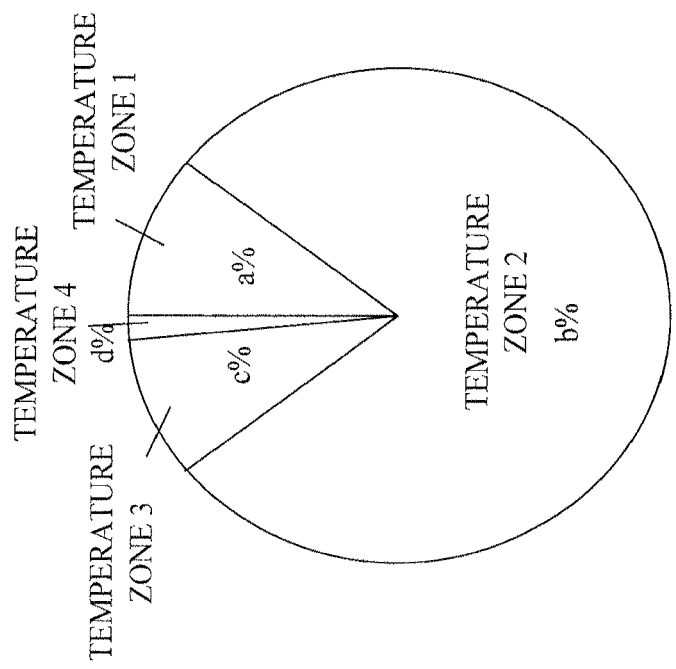
FIG. 3 is a graph illustrating a relationship of a lifetime workload against temperature history distribution and battery temperature of a battery.

The memory 11 acquires temperature of the battery 20 detected by the temperature sensor 101 at predetermined timing to store it temporarily. Further, the memory 11 also store a unit lifetime workload consumed per unit distance with respect to temperature of the battery 20 as shown in FIG. 3B.

The accumulated discharge amount detecting section 12 detects an accumulated amount of discharge of the battery 20 (the accumulated amount of current value discharged from the battery 20) on the basis of the detected data of the electric current and voltage sensor 102; data on the detected accumulated amount of discharge of the battery 20 are outputted to the memory 11; and are stored temporarily. Further, the comparing section 17 as an actual workload increase rate calculating section of the present invention calculates an actual workload increase rate indicating a slope of the actual workload as described above on the basis of an accumulated amount of discharge of the battery 20 detected by the accumulated discharge amount detecting section 12 and stored in the memory 11 and a travel distance detected by the travel distance detecting section 13 and stored in the memory 11.

In this regard, in place of the accumulated discharge amount detecting section 12, the actual workload increase rate calculating section according to the present invention may detect an accumulated charge amount (an accumulated amount of the current value flowing into the battery 20) to calculate an actual workload increase rate on the basis of the detected accumulated charge amount, or may detect an accumulated electric power amount (an accumulated amount of the product of a current value and a voltage value of the battery 20) to calculate an actual workload increase rate on the basis of the detected accumulated electric power amount.

In the present embodiment, the travel distance detecting section 13 detects a travel distance of the vehicle 1 during one drive cycle (hereinafter, referred to as "one DC") on the basis of the number of revolutions data of the axle shafts 6R, 6L detected by the rotation sensor 104. More specifically, the travel distance detecting section 13 detects (or calculates) a travel distance of the vehicle 1 by multiplying a circumferential length of wheel of each of the front wheels 7R, 7L by the number of revolutions of the axle shafts 6R, 6L. The detected travel distance data of the vehicle 1 is outputted to the memory 11, and are temporarily stored therein. In this regard, travel distance detecting section 13 may calculate the travel distance of the vehicle 1 on the basis of a value of integral of the vehicle speed of the vehicle 1 detected by the vehicle speed sensor (not shown in the drawings).

In the present embodiment, the temperature history distribution calculating section 14 calculates temperature history distribution of the battery 20 from the time when the temperature sensor 101 starts to detect temperature of the battery 20 during one DC to now (during one DC). More specifically, the temperature history distribution calculating section 14 makes up temperature of the battery 20 during one DC temporarily stored in the memory 11 for each predetermined temperature history range as shown in FIG. 3A, and calculates a ratio of the respective temperature history ranges as a distribution chart.

In the present embodiment, it is classified into four steps of a temperature zone 1, a temperature zone 2, a temperature zone 3, and a temperature zone 4 (temperature zone 1<temperature zone 2<temperature zone 3<temperature zone 4) as the temperature history ranges. However, in the present invention, it may be configured so that the distribution is acquired for every one ° C. without classifying the temperature history into appropriate temperature history zones and acquiring the distribution thereof.

The lifetime workload calculating section 15 calculates a lifetime workload of the battery 20 when the battery 20 is used at such a temperature history distribution on the basis of distribution of temperature history of the battery 20 calculated by the temperature history distribution calculating section 14 (an appearance rate in each of the temperature ranges) and a unit lifetime workload stored in the memory 11 in advance (see FIG. 3B). More specifically, as shown in FIG. 4A, the lifetime workload calculating section 15 calculates a lifetime workload Wt of the battery 20 at which the vehicle 1 can drive toward a target travel distance Dt, for example, on the basis of temperature history distribution of the battery 20 when an integrated value of the travel distance of the vehicle 1 detected by the travel distance detecting section 13 reaches a predetermined travel distance X km and a unit lifetime workload of each of the temperature zones.

The workload increase rate permissible value calculating section 16 calculates a permissible value of a workload increase rate indicating a workload increasing per unit distance on the basis of the lifetime workload Wt calculated by the lifetime workload calculating section 15 and the travel distance detected by the travel distance detecting section 13.

Figure 4A:
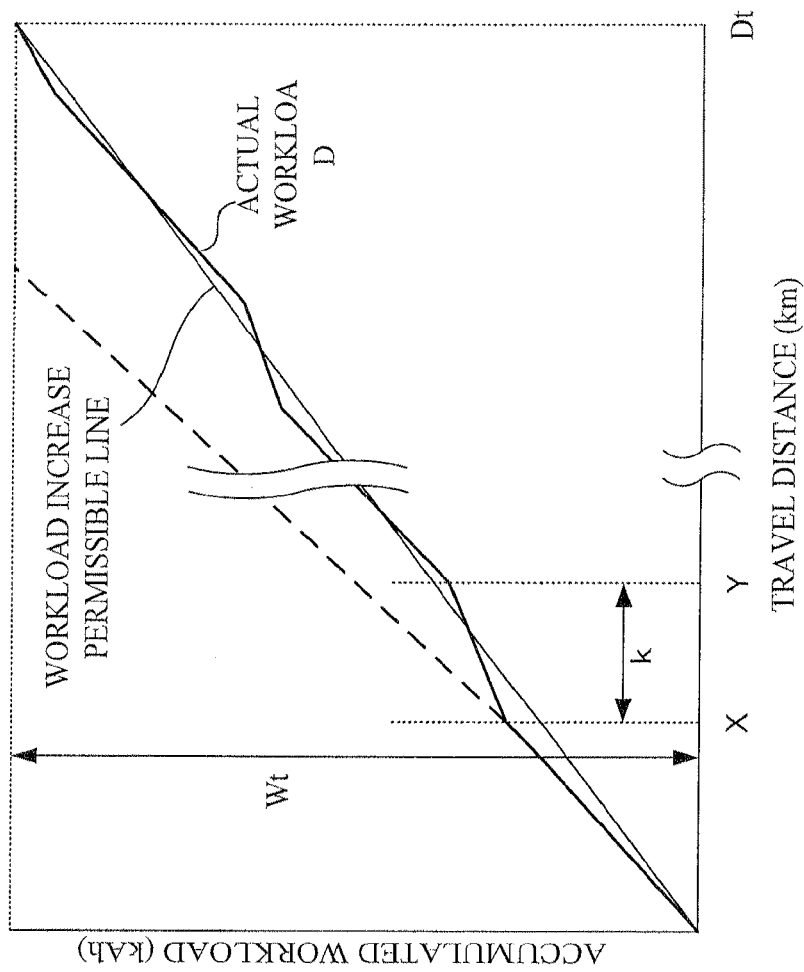
FIG. 4 is a graph illustrating transition of a lifelong workload of the battery and an output image at output restriction on the battery.

Here, the workload increase rate is a value obtained by dividing the accumulated workload by the travel distance, that is, a slope of the actual workload in a graph of FIG. 4A. In the present embodiment, in the case where the workload increase rate is larger than the slope of the workload increase permissible line like when the Dt of FIG. 4A is X, it is controlled so that the actual workload approaches the workload increase permissible line by putting restriction on the output of the battery 20 as will be described later. In this regard, in FIG. 4A, the target travel distance Dt is a travel distance that becomes a target at which the vehicle 1 on which the battery 20 is mounted should drive without exchanging the battery 20, and is a constant value regardless of a type of vehicle. Further, the lifetime workload Wt described above changes depending upon the temperature history of the battery 20. By causing the actual workload to approach the workload increase permissible line, it is possible to cause the lifelong travel distance of the vehicle 1 to approach the target travel distance Dt while prolonging the lifetime of the battery 20.

The comparing section 17 compares the calculated actual workload increase rate with the permissible value of the workload increase rate calculated by the workload increase rate permissible value calculating section 16. A comparison result by the comparing section 17 is outputted to the battery output restricting section 18.

The battery output restricting section 18 further restricts the output by a restricted value based upon a difference between the actual workload increase rate and the permissible value of the workload increase rate from the output of the battery 20 restricted in a normal driving mode if necessary in the case where the comparison result that the actual workload increase rate is larger than the permissible value of the workload increase rate is inputted from the comparing section 17.

Here, the output of the battery 20 restricted in the normal driving mode if necessary means an output of the battery 20 to be restricted for the reason that a remaining capacity SOC of the battery 20 becomes a predetermined value or lower, for example. In this regard, the SOC of the battery 20 is an estimate value by the electronic control unit 10, and is calculated (estimated) by the electronic control unit 10 on the basis of an electric current amount and voltage at discharge and charge of the battery 20 detected by the electric current and voltage sensor 102.

Figure 4B:
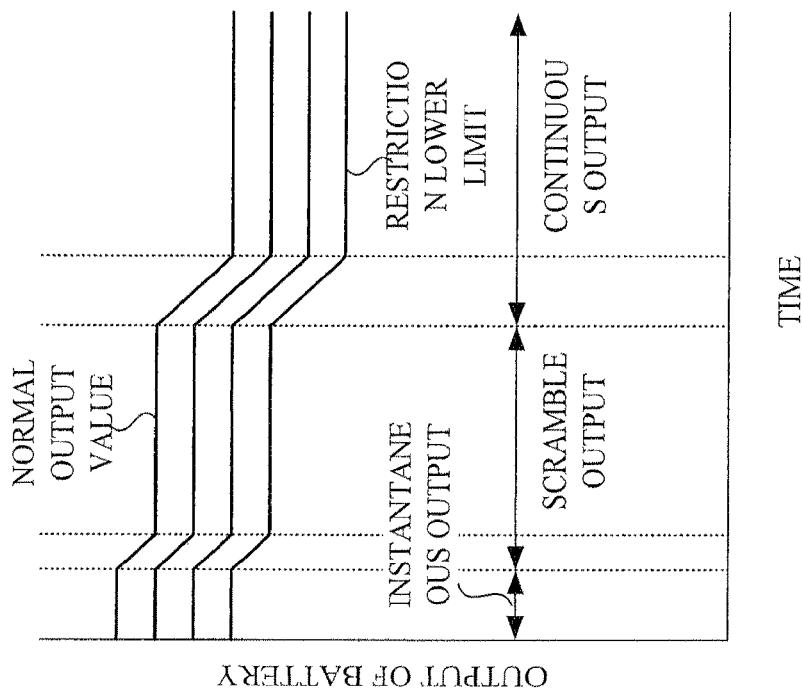

In this regard, the output of the battery 20 may be controlled so as to be decreased in accordance with the elapsed time from the start of the vehicle 1. More specifically, as shown in FIG. 4B, the PDU 30 may control the battery 20 so that an instantaneous output for about one second, for example from the start of the vehicle 1, a scramble output, which is smaller than the instantaneous output, for about 3 to 10 seconds thereafter, and a continuous output, which is further smaller than the scramble output, thereafter are discharge.

In the present embodiment, the temperature sensor 101 detects temperature of the battery 20 from start to stop of the vehicle 1, that is, every predetermined timing during one DC, and outputs the detected temperature data to the memory 11 of the electronic control unit 10. The temperature history distribution calculating section 14 then calculates, as temperature history distribution, distribution of the temperature history of the battery 20 detected in the period of time from the start of the vehicle 1 to the latest detection time point by the temperature sensor 101.

Figure 5:
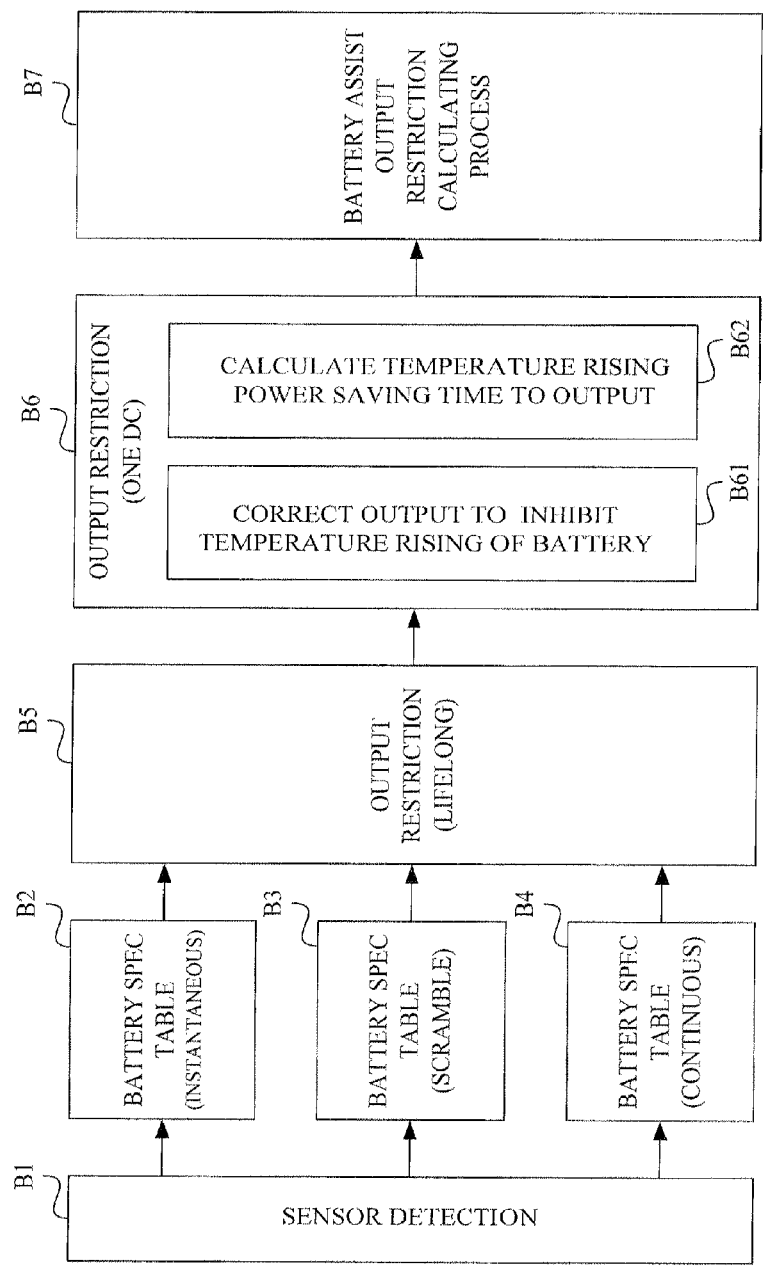
FIG. 5 is a block diagram for explaining an output limiting process for the battery.

Next, an outline of an output limiting process for the battery 20 carried out by the battery charge/discharge control apparatus (electronic control unit 10) according to the present embodiment will be described. FIG. 5 is a block diagram for explaining an output limiting process for the battery 20.

As shown in FIG. 5, when minimum temperature, maximum temperature, a current value and a voltage value of the battery 20 are detected by the temperature sensor 101 and the electric current and voltage sensor 102 (Block B1), the electronic control unit 10 calculates (or estimates) a SOC of the battery 20 on the basis of the current value and the voltage value, and searches spec values of the battery 20 on the basis of these data using a battery spec table corresponding to each output (Blocks B2 to B4). Output restriction during lifelong drive of the vehicle 1 is made on the basis of the searched spec values of the battery 20 in a second embodiment (will be described later) (Block B5). In this regard, this output restriction during the lifelong drive is substantially similar to the output restriction during one DC except for only a point that targets of the temperature history distribution are different from each other. Thus, detailed explanations thereof are omitted herein.

Then, at the output restriction during one DC (Block B6), the electronic control unit 10 first calculates a corrected value of each output of the battery 20 on the basis of the respective spec values of the battery 20 in order to inhibit temperature rising of the battery 20 (Block B61), and calculates power saving time to output this corrected value for inhibiting temperature rising (Block B62). The electronic control unit 10 then carries out a calculating process of assist output restriction of the battery 20 on the basis of the corrected value and the power saving time with respect to the respective outputs (Block B7).

Figure 6:
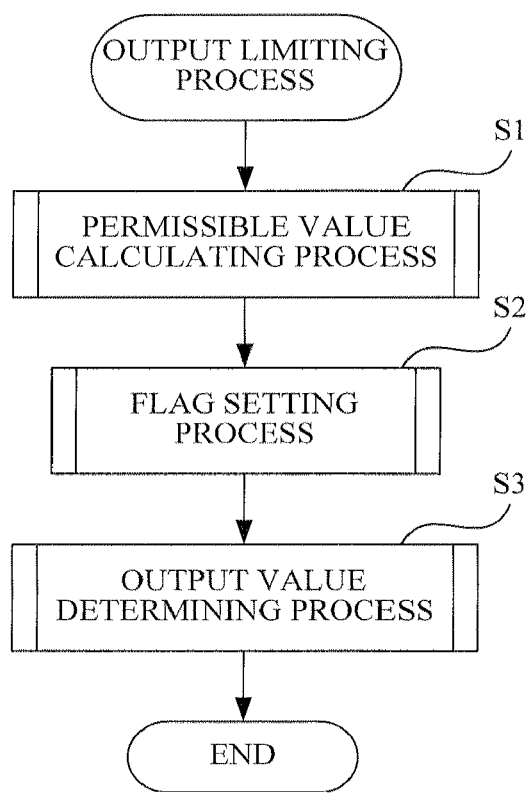
FIG. 6 is a flowchart showing the output limiting process carried out by the electronic control unit according to a first embodiment of the present invention.

Next, an operation of the battery charge/discharge control apparatus (electronic control unit 10) according to the present embodiment will be described using FIG. 2 and FIG. 6. FIG. 6 is a flowchart showing the output limiting process carried out by the electronic control unit 10 according to a first embodiment of the present invention. This output limiting process is carried out tenth times in a row every 10 milliseconds, for example, at start of the vehicle 1.

In the output limiting process, the electronic control unit 10 first carries out a permissible value calculating process (Step S1). Subsequently, the electronic control unit 10 carries out a flag setting process on the basis of the workload difference calculated in the permissible value calculating process (Step S2). Subsequently, the electronic control unit 10 carries out an output value determining process on the basis of the flag set up in the flag setting process (Step S3), and terminates this output limiting process.

Figure 7:
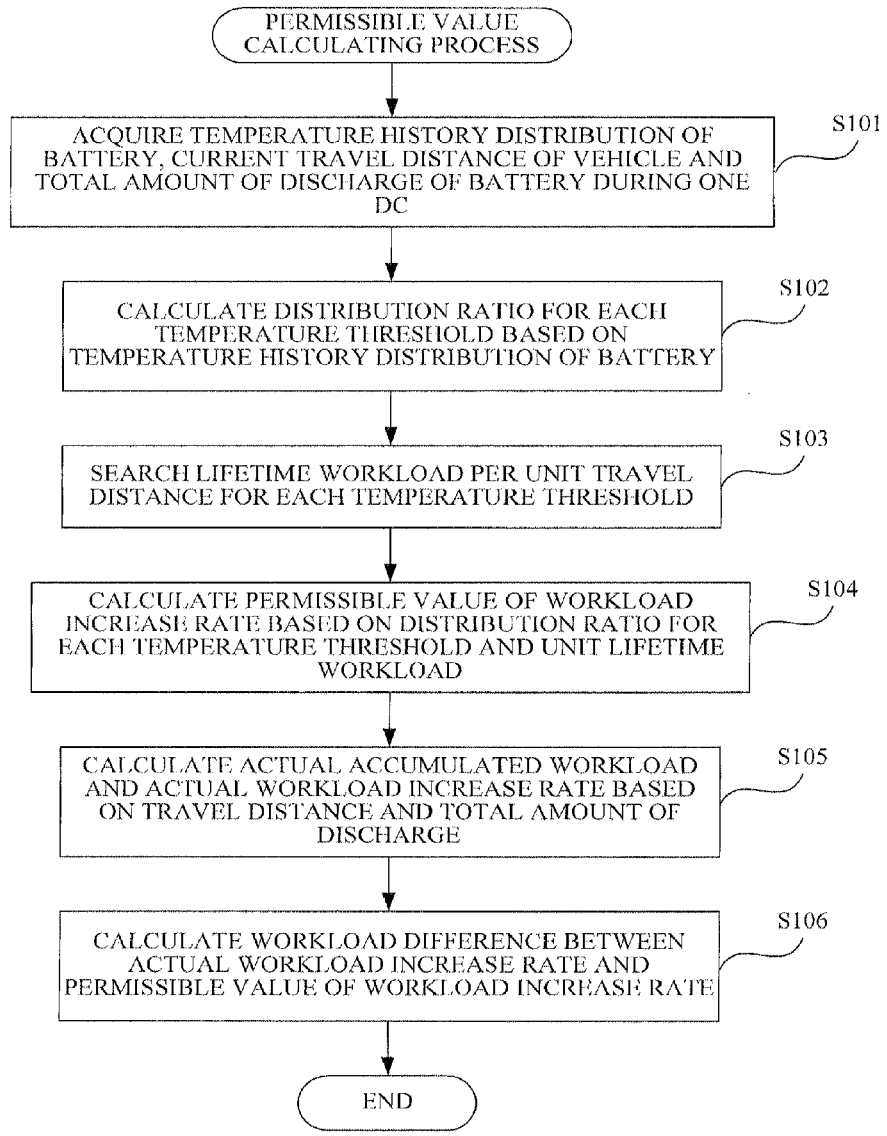
FIG. 7 is a flowchart showing a permissible value calculating process according to the first embodiment of the present invention.
Figure 8:
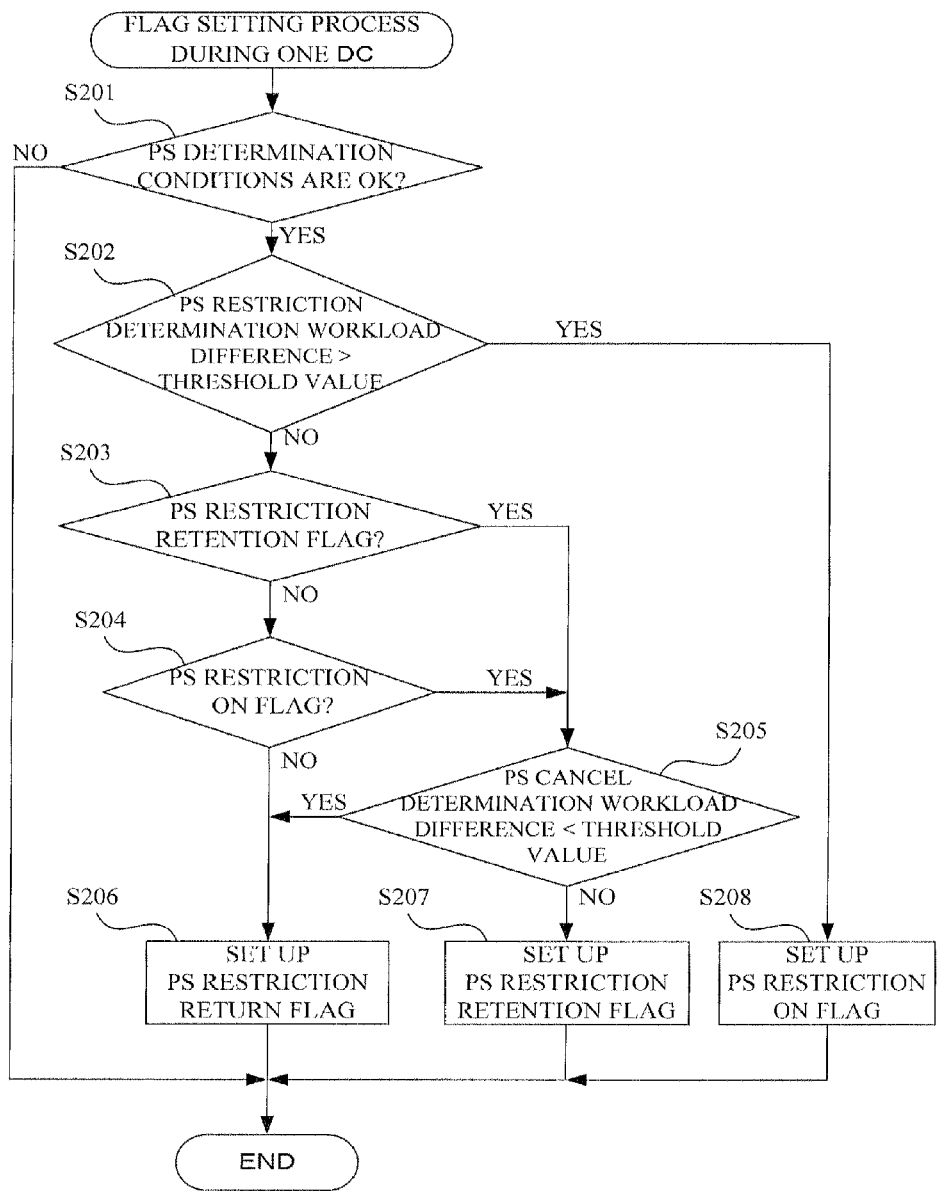
FIG. 8 is a flowchart showing a flag setting process during one drive cycle according to the first embodiment of the present invention.
Figure 9:
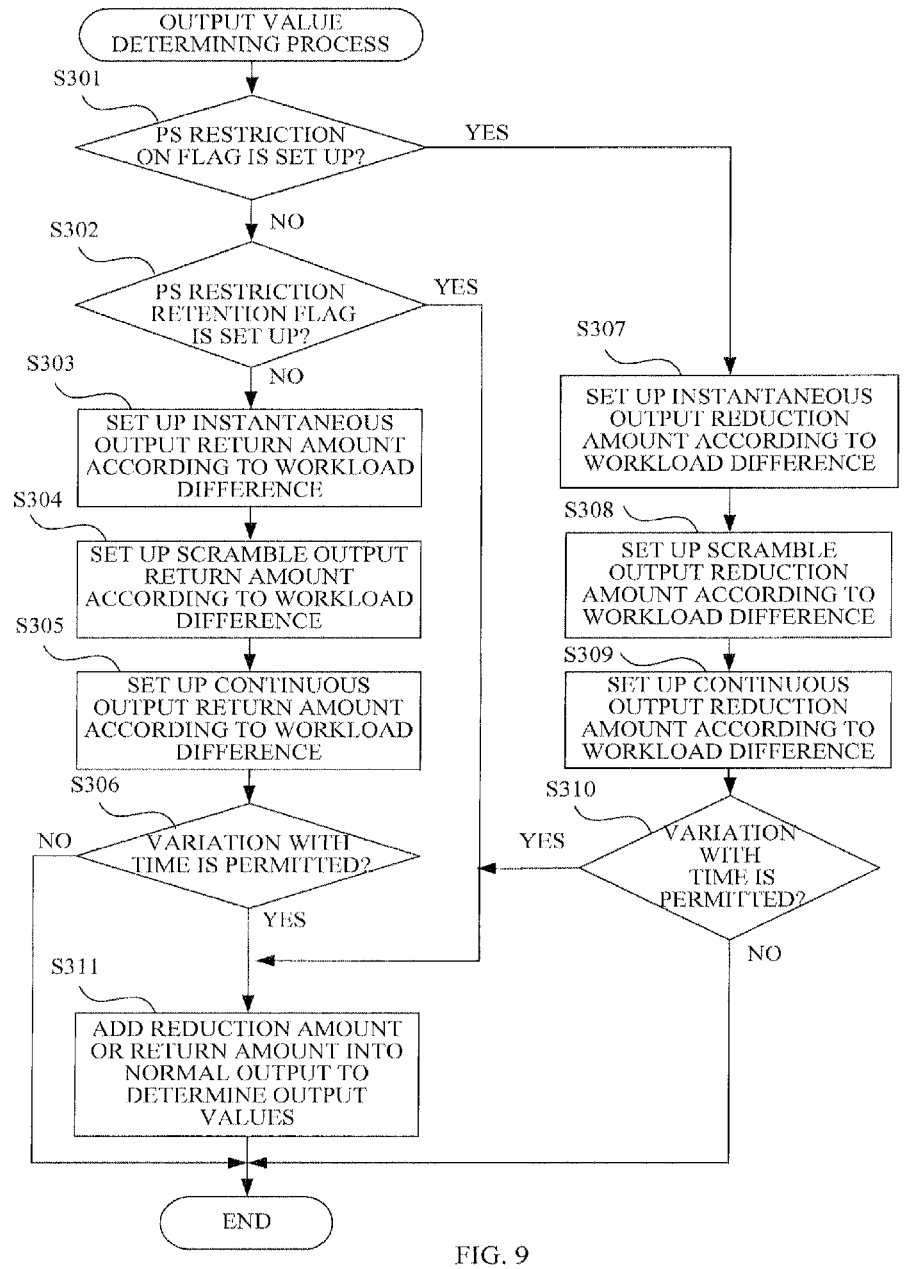
FIG. 9 is a flowchart showing an output value determining process according to the first embodiment of the present invention.

Next, a detailed flow of the flowchart shown in FIG. 6 will be described. FIG. 7 is a flowchart showing the permissible value calculating process according to the first embodiment of the present invention. FIG. 8 is a flowchart showing the flag setting process during one drive cycle according to the first embodiment of the present invention. FIG. 9 is a flowchart showing the output value determining process according to the first embodiment of the present invention.

In the permissible value calculating process, the electronic control unit 10 acquires: the temperature history distribution of the battery 20 stored in the memory 11 during one DC; the travel distance of the vehicle 1 detected by the travel distance detecting section 13 during one DC and stored in the memory 11; and the total amount of discharge of the battery 20 detected by the accumulated discharge amount detecting section 12 during one DC and stored in the memory 11 (Step S101), and outputs these data to the temperature history distribution calculating section 14.

The temperature history distribution calculating section 14 calculates a distribution ratio for each temperature threshold (temperature region) on the basis of the temperature history distribution of the battery 20 stored in the memory 11 (Step S102). For example, in the example shown in FIG. 3A, a ratio of the temperature region of the temperature zone 1 is a %, a ratio of the temperature region of the temperature zone 2 is b %, and a ratio of the temperature region of the temperature zone 3 is d %.

Subsequently, the lifetime workload calculating section 15 searches a lifetime workload per unit travel distance for each temperature threshold as shown in FIG. 3B, that is, unit lifetime workloads (Step S103), and outputs the searched unit lifetime workloads to the workload increase rate permissible value calculating section 16. The workload increase rate permissible value calculating section 16 calculates a permissible value of the workload increase rate on the basis of a distribution ratio for each temperature threshold calculated at Step S102 and the unit lifetime workload thereof (Step S104). In the examples shown in FIG. 3A and FIG. 3B, the permissible value of the workload increase rate at this stage becomes a value as mentioned below using the unit lifetime workload of each temperature zone and the ratio thereof. In this regard, the lifetime workload per unit distance of FIG. 3B is shown as one example.

$$(\text{Permissible value of workload increase rate}) = A \times a/100 + B \times b/100 + C \times c/100 + D \times d/100$$

Here, the lifetime workload of each temperature zone in FIG. 3B can be expresses as the total workload consumed by the battery 20 when the vehicle 1 drives to a target travel distance Dt assumed in advance with a corresponding lifetime workload (unit lifetime workload) per unit travel distance. For example, when it is assumed that the vehicle 1 drives to the target travel distance Dt in a state that temperature of the battery 20 is in the temperature zone 1, a lifetime workload W1 of the temperature zone 1 and a lifetime workload A per unit distance have a relationship mentioned below.

$$A = W1/Dt$$

In this regard, in the case where lifetime workloads of the temperature zones 1 to 4 respectively denote W1 to W4 and the corresponding lifetime workloads per unit distance denote A to D, similar relationships are satisfied between W2 and B, between W3 and C, and between W4 and D. Here, using the distribution ratios of the respective temperature zones in FIG. 3A, a relationship described below is satisfied between W1 to W4 and Wt.

$$Wt = W1 \times a/100 + W2 \times b/100 + W3 \times c/100 + W4 \times d/100$$

In this regard, from a relationship of <lifetime workload A (Ah/km) per unit travel distance=lifetime workload W1 (kAh)/Dt>, by first calculating the lifetime workloads A to D per unit distance of the respective temperature zones on the basis of FIG. 3B, calculating the lifetime workload Wt on the basis of the distribution ratio of FIG. 3A as described above, and dividing this lifetime workload Wt by the target travel distance Dt, the lifetime workload per unit travel distance can be acquired. In this case, a calculation formula of the lifetime workload W1 is similar to a calculation formula for acquiring the permissible value of the workload increase rate, and it is equivalent to "A×Dt" to "D×Dt" by multiplying the target travel distance Dt by the lifetime workloads A to D per unit distance of the respective temperature zones. "A×Dt" to "D×Dt" may be stored in the memory 11 in place of the lifetime workloads A to D per unit distance of the respective temperature zones.

Subsequently, the comparing section 17 (here, the actual workload increase rate calculating section) calculates an actual workload increase rate indicating the actual accumulated workload of the vehicle 1 and a slope of the accumulated workload on the basis of the travel distance of the vehicle 1 during one DC stored in the memory 11 and the total amount of discharge of the battery 20 during one DC stored in the memory 11 (Step S105). The comparing section 17 then compares this actual workload increase rate with the permissible value of the workload increase rate calculated at Step S104; calculates a workload difference thereof (Step S106); and terminate this permissible value calculating process.

Here, the permissible value of the workload increase rate will be explained specifically using FIG. 4A. FIG. 4A illustrates a relationship between the actual workload increase rate and the permissible value of the workload increase rate. As mentioned above, the actual workload increase rate is a value obtained by dividing the actual accumulated workload by the travel distance. For this reason, it corresponds to a slope of the actual workload with respect to the predetermined travel distance as shown in FIG. 4A. Further, the permissible value of the workload increase rate is a value obtained by dividing the lifetime workload on the basis of the distribution ratio of each temperature zone by the target travel distance Dt. For this reason, it corresponds to the workload increase permissible line shown in FIG. 4A. In this example, in order to facilitate understanding thereof, the workload increase permissible line is shown as a linear function in which temperature is constant. For example, in the example shown in FIG. 4A, since the actual workload exceeds the workload increase permissible line when the travel distance reaches X (km), the permissible value of the workload becomes a negative value. Since the actual workload is lower than the workload increase permissible line when the travel distance reaches Y (>X) (km), the permissible value of the workload becomes a positive value. In the case where the permissible value of the workload is a negative value, the output of the battery 20 is to be restricted in the output value determining process (will be described later). This makes it possible to prolong the lifetime of the battery 20 by means of a simple control logic. On the other hand, in the case where the permissible value of the workload is a positive value, the output restriction of the battery 20 is canceled in the output value determining process, and a driving range in which the battery 20 and the engine 2 are used together may be increased according to the circumstances. Therefore, it is possible to cause the total travel distance of the vehicle 1 in the lifetime workload of the battery 20 to approach the target travel distance Dt, and it is also possible to heighten gasoline mileage (fuel economy) of the vehicle 1 due to increase in a combination driving range.

Next, a flag setting process during one DC according to the present embodiment will be described. The electronic control unit 10 first determines whether power saving for restricting the output of the battery 20 can be carried out or not. Namely, the electronic control unit 10 determines whether PS determination conditions are satisfied or not (Step S201). The PS determination conditions include whether temperature of the battery 20 is in a predetermined temperature region or not, whether a driving state of the vehicle 1 is in a state that a high output of the battery 20 is required or not, and the like. The driving state requiring a high output of the battery 20 includes a state that the vehicle 1 drives up the slope having a large inclination, for example.

In the case where it is determined at Step S201 that the PS determination conditions are not satisfied, the electronic control unit 10 terminates this flag setting process during one DC as it is. On the other hand, in the case where it is determined that the PS determination conditions are satisfied, the electronic control unit 10 determines whether the workload difference calculated in the permissible value calculating process is equal to or larger than a first threshold or not as determination of whether the PS restriction is to be carried out or not (Step S202).

In the case where it is determined that the workload difference is equal to or larger than the first threshold, the electronic control unit 10 sets up a PS restriction ON flag in order to request output restriction of the battery 20 (Step S208), and terminates this flag setting process during one DC. In the case where it is determined that the workload difference is smaller than the first threshold, the electronic control unit 10 subsequently determines whether a PS restriction retention flag is set up or not and whether the PS restriction ON flag is set up or not (Steps S203, S204).

In the case where it is determined that neither a PS restriction retention flag nor the PS restriction ON flag is set up, the electronic control unit 10 sets up a PS restriction return flag (Step S206), and terminates this flag setting process during one DC. On the other hand, in the case where it is determined that either a PS restriction retention flag or the PS restriction ON flag is set up, the electronic control unit 10 subsequently determines whether the workload difference is equal to or smaller than a second threshold, which is smaller than the first threshold, or not as determination of whether the PS restriction is canceled or not (Step S205). In the case where it is determined that the workload difference is equal to or smaller than the second threshold, the electronic control unit 10 sets up the PS restriction return flag (Step S206), and terminates this flag setting process during one DC. On the other hand, in the case where it is determined that the workload difference is larger than the second threshold, the electronic control unit 10 sets up the PS restriction retention flag (Step S207), and terminates this flag setting process during one DC.

Next, the output value determining process to determine the output value of the battery 20 on the basis of the flag set up in the flag setting process during one DC will be described. The electronic control unit 10 first determines whether the PS restriction ON flag is set up or not and whether the PS restriction retention flag is set up or not (Steps S301, S302).

In the case where it is determined at Step S302 that the PS restriction retention flag is set up, the electronic control unit 10 adds the reduction amount or the return amount of each output set up in the previous processing to a normal output of the battery 20 to determine the output values of the battery 20 (Step S311), and terminates this output value determining process. In the case where it is determined that neither the PS restriction ON flag or the PS restriction retention flag is set up, the electronic control unit 10 sets up an instantaneous output return amount in accordance with the workload difference calculated in the permissible value calculating process (Step S303); sets up a scramble output return amount (Step S304); and sets up a continuous output return amount (Step S305).

The electronic control unit 10 then determines whether a variation with time is permitted or not (Step S306). Namely, the electronic control unit 10 determines a change of the respective outputs is permitted on the basis of whether this series of processes is repeated ten times in a row every 10 milliseconds or not. In the case where it is determined that the change of the respective outputs of the battery 20 is not permitted, the electronic control unit 10 terminates this output value determining process as it is.

On the other hand, in the case where it is determined that the change of the respective outputs of the battery 20 is permitted, the electronic control unit 10 adds a return amount of each output set up at Steps S303 to S305 to a normal output value of the battery 20; determines the output value of the battery 20 (Step S311); and terminates this output value determining process.

In the case where it is determined at Step S301 that the PS restriction ON flag is set up, the electronic control unit 10 sets up an instantaneous output reduction amount in accordance with the workload difference calculated in the permissible value calculating process (Step S307); sets up a scramble output reduction amount (Step S308); and sets up a continuous output reduction amount (Step S309).

The electronic control unit 10 then determines whether a variation with time is permitted or not as well as the process at Step S306 (Step S310). Namely, the electronic control unit 10 determines whether a change of the respective outputs is permitted on the basis of whether this series of processes is repeated ten times in a row every 10 milliseconds or not. In the case where it is determined that the change of the respective outputs of the battery 20 is not permitted, the electronic control unit 10 terminates this output value determining process as it is.

On the other hand, in the case where it is determined that the change of the respective outputs of the battery 20 is permitted, the electronic control unit 10 adds the reduction amount of each of the outputs set up at Steps S307 to S309 into the normal output value of the battery 20 to determine output values of the battery 20 (Step S311), and terminates this output value determining process. In the processes at Step S307 to S309, a reduction amount of each of the outputs is a negative value. For this reason, each output value of the battery 20 is restricted to a value smaller than the normal output value. Here, using a map created so that the larger the workload difference is, the larger the reduction amount of each output of the battery 20 to be set up is, each output value of the battery 20 may be determined.

In this regard, the output value of the battery 20 determined at Step S311 is outputted to the PDU 30 as a command value from the electronic control unit 10. The PDU 30 restricts the output of the battery 20 gradually from the normal output value of the battery 20 if necessary on the basis of this command value, for example, as shown in FIG. 4B. In this way, the battery output restricting section 18 may control the PDU 30 so as to gradually change the output of the battery 20 in accordance with the restricted value of the output of the battery 20.

In this regard, although the illustration and explanation thereof are omitted, a theory opposite to the explanation described above is satisfied at regeneration of the electric motor 3. Namely, in the case where the electric motor 3 is regenerated (for example, in the case where a regeneration brake is applied in the vehicle 1), electric power (electrical energy) generated in the electric motor 3 is supplied to the battery 20. For that reason, by reversing positive and negative of the threshold corresponding to the output of the battery 20, similar control such that charge to the battery 20 is restricted at regeneration of the electric motor 3 can also be carried out. In this manner, he electronic control unit 10 may control the PDU 30 so as to restrict a charge amount to the battery 20 while the battery output restricting section 18 restricts the output of the battery 20.

Second Embodiment

Hereinafter, a second embodiment of the present invention will be described. In this regard, a vehicle according to the second embodiment has a configuration similar to that of the vehicle 1 according to the first embodiment, and an electronic control unit according to the second embodiment also has a configuration similar to that of the electronic control unit 10 according to the first embodiment. Therefore, the illustration and explanation of the vehicle and the electronic control unit are omitted.

In the present embodiment, control thereof is different from that in the first embodiment in that the temperature history distribution of the battery 20 during one DC is not used, but temperature history distribution of the battery 20 during lifelong drive of the vehicle 1 is used. When an output of the battery 20 is restricted using the temperature history distribution of the battery 20 during the lifelong drive, in order to inhibit disturbance such as data at a temporary high load of the battery 20, temperature history distribution of the battery 20 for a certain amount of travel distance is to be used. In this regard, as shown in FIG. 5, a battery charge/discharge control apparatus according to the present invention may be configured so as to carry out both controls of the first embodiment (one DC) and the second embodiment (lifelong).

In the present embodiment, the temperature sensor 101 detects temperature of the battery 20 every predetermined timing from start to stop of the vehicle 1, and outputs the detected temperature data to the memory 11 of the electronic control unit 10. The temperature history distribution calculating section 14 then calculates, as temperature history distribution, distribution of the temperature history of the battery 20 detected in the period of time from the time when the vehicle 1 is first started (for example, at factory shipment) to the latest detection time point by the temperature sensor 101.

Figure 10:
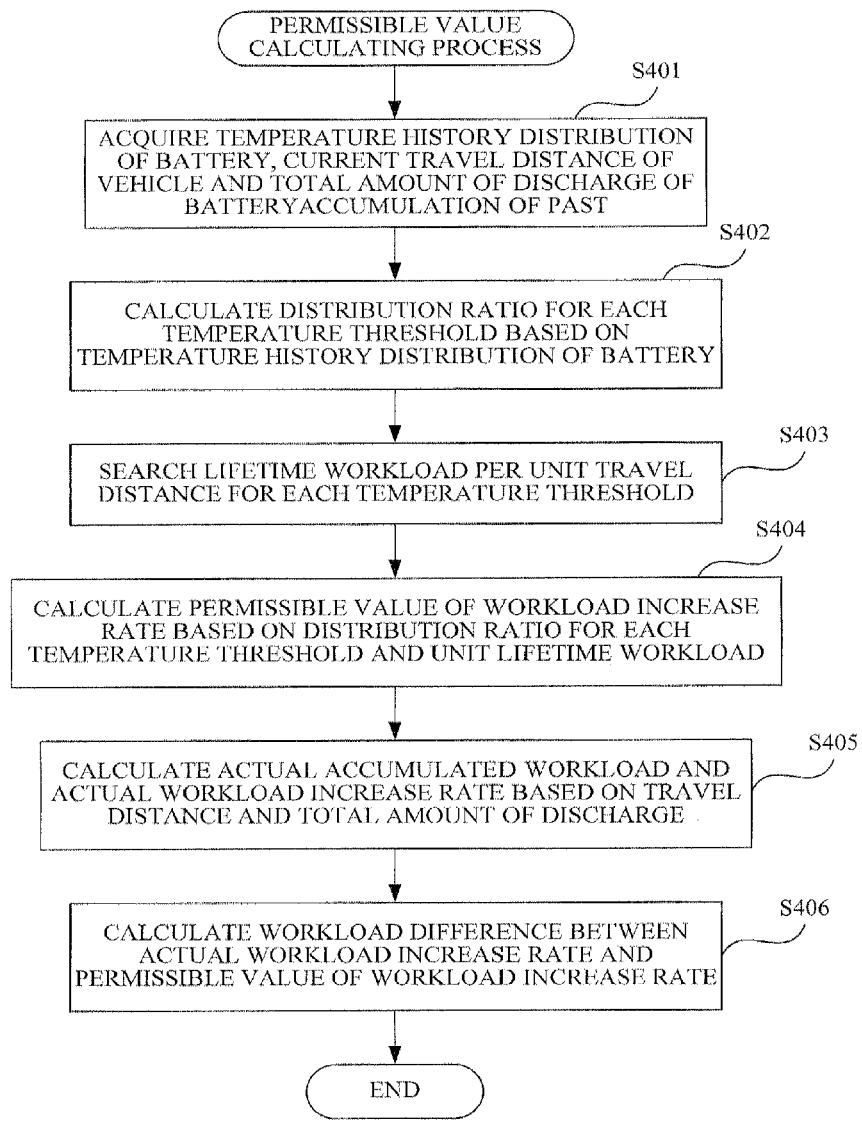
FIG. 10 is a flowchart showing a permissible value calculating process according to a second embodiment of the present invention.
Figure 11:
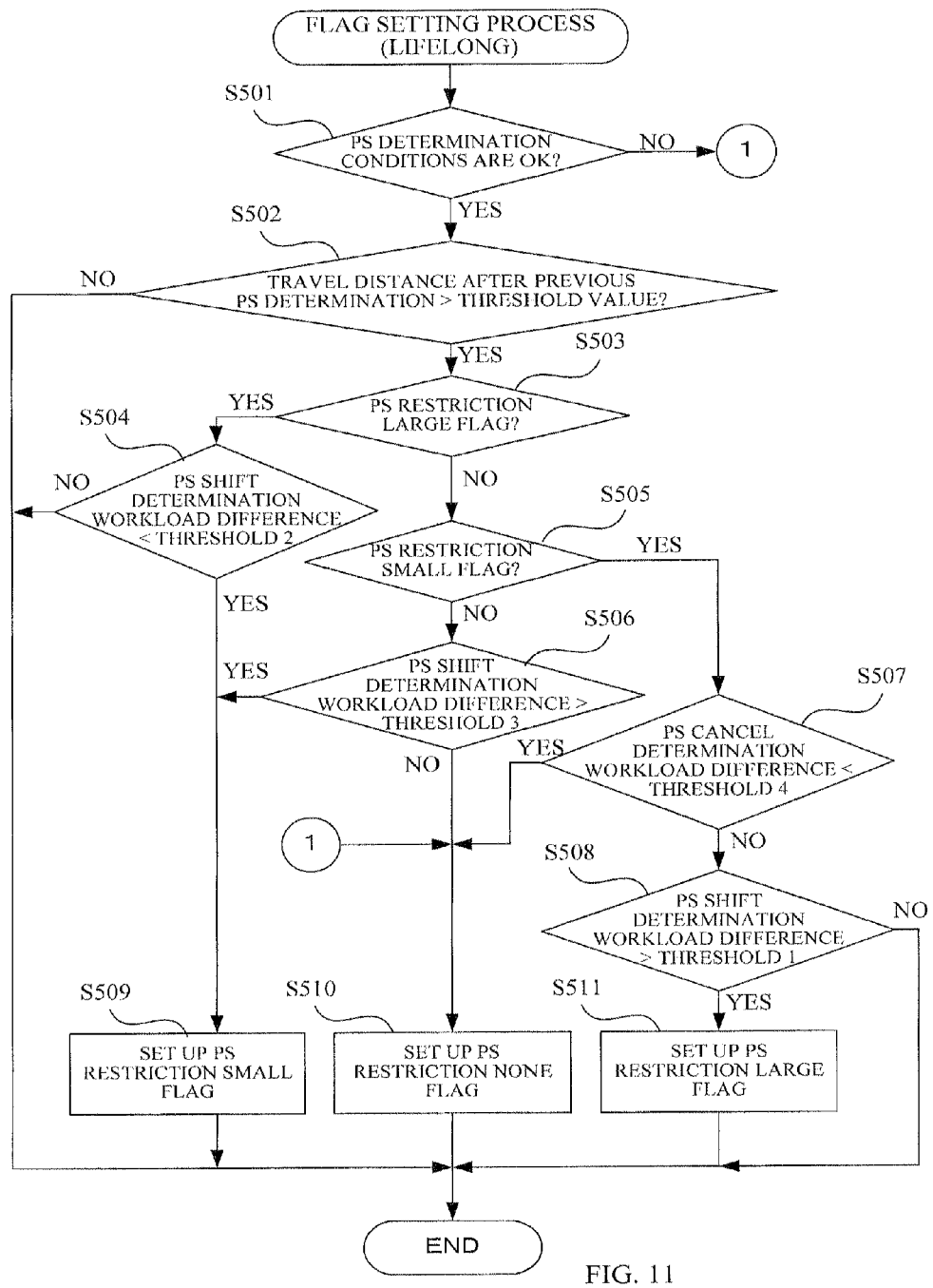
FIG. 11 is a flowchart showing a flag setting process during lifelong drive according to the second embodiment of the present invention.
Figure 12:
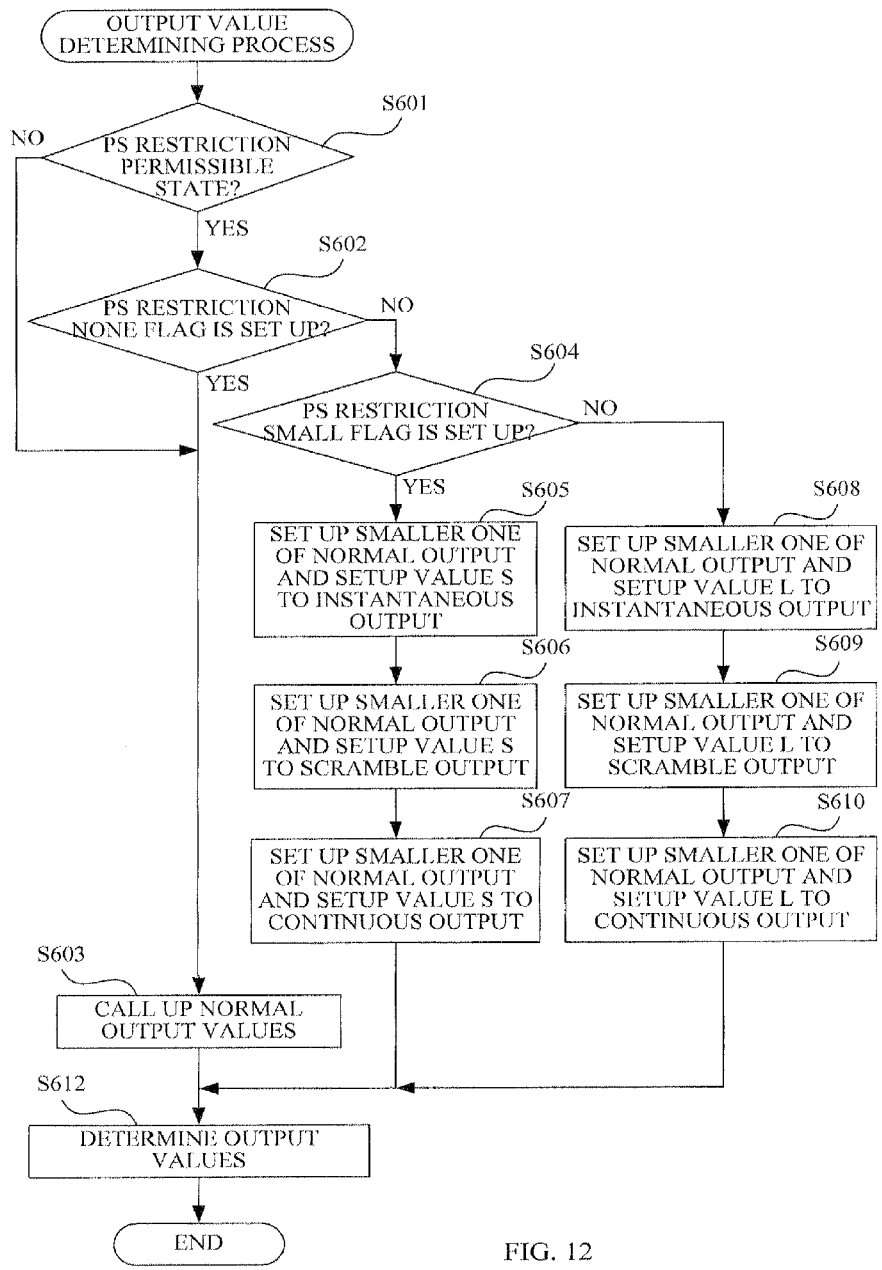
FIG. 12 is a flowchart showing an output value determining process according to the second embodiment of the present invention.

Next, an operation of the battery charge/discharge control apparatus according to the second embodiment will be described using the block diagrams of FIG. 1 and FIG. 2 and flowcharts of FIGS. 10 to 12. In this regard, since the overall flow of the output limiting process according to the present embodiment is similar to the output limiting process according to the first embodiment shown in FIG. 6, the illustration and explanation thereof are omitted. FIG. 10 is a flowchart showing a permissible value calculating process according to the second embodiment of the present invention. FIG. 11 is a flowchart showing a flag setting process during the lifelong drive according to the second embodiment of the present invention. FIG. 12 is a flowchart showing an output value determining process according to the second embodiment of the present invention. The permissible value calculating process, the flag setting process during the lifelong drive and the output value determining process are carried out as a series of processes tenth times in a row every 10 milliseconds, for example, at start of the vehicle 1.

In the permissible value calculating process, the electronic control unit 10 acquires: the temperature history distribution of the battery 20 stored in the memory 11 as accumulated one of the past that has been detected until now; the total travel distance of the vehicle 1 detected by the travel distance detecting section 13 and stored in the memory 11 as accumulated one of the past that has been detected until now; and the total amount of discharge of the battery 20 detected by the accumulated discharge amount detecting section 12 and stored in the memory 11 as accumulated one of the past that has been detected until now (Step S401), to output these data to the temperature history distribution calculating section 14.

The temperature history distribution calculating section 14 calculates a distribution ratio for each temperature threshold (temperature region) on the basis of the lifelong temperature history distribution of the battery 20 stored in the memory 11 (Step S402).

Subsequently, the lifetime workload calculating section 15 searches a lifetime workload per unit travel distance for each temperature threshold, that is, unit lifetime workloads (Step S403), and outputs the searched unit lifetime workloads to the workload increase rate permissible value calculating section 16. The workload increase rate permissible value calculating section 16 calculates a permissible value of the workload increase rate for the lifelong lifetime workload on the basis of a distribution ratio for each temperature threshold calculated at Step S402 and the unit lifetime workload thereof (Step S404).

The workload increase rate permissible value calculating section 16 then calculates a permissible value of the workload increase rate at this time on the basis of the lifelong lifetime workload calculated by the lifetime workload calculating section 15, the lifelong travel distance of the vehicle 1 detected by the travel distance detecting section 13 and stored in the memory 11, and the target travel distance Dt (see FIG. 4A) (Step S405).

In the example shown in FIG. 4A according to the present embodiment, when the travel distance reaches X (km), the electronic control unit 10 determines whether the output of the battery 20 is restricted or not for the first time. Here, since the actual workload exceeds the workload increase permissible line, the permissible value of the workload becomes a negative value, and as will be described later, the electronic control unit 10 restricts an output value of the battery 20 so as to be decreased. Next, when the travel distance reaches Y (>X) (km), the electronic control unit 10 carries out the second determination. Here, since the actual workload is lower than the workload increase permissible line, the permissible value of the workload becomes a positive value, and as will be described later, the electronic control unit 10 controls to cancel the restriction of the output of the battery 20.

Subsequently, the comparing section 17 (here, the actual workload increase rate calculating section) calculates an actual workload increase rate indicating the actual accumulated workload of the vehicle 1 and a slope of the accumulated workload on the basis of the total travel distance of the vehicle 1 stored in the memory 11 and the total amount of discharge of the battery 20 stored in the memory 11 (Step S405). The comparing section 17 then compares this actual workload increase rate with the permissible value of the workload increase rate calculated at Step S404; calculates the workload difference thereof (Step S406); and terminates this permissible value calculating process.

Next, the flag setting process for the lifelong drive will be described. The electronic control unit 10 first determines whether power saving for restricting the output of the battery 20 can be carried out or not. Namely, the electronic control unit 10 determines whether the PS determination conditions are satisfied or not (Step S501). The PS determination conditions include whether temperature of the battery 20 is in a predetermined temperature region or not, whether a driving state of the vehicle 1 is in a state that a high output of the battery 20 is required or not, and the like. The driving state requiring a high output of the battery 20 includes a state that the vehicle 1 drives up the slope having a large inclination, for example.

In the case where it is determined at Step S501 that the PS determination conditions are not satisfied, the electronic control unit 10 sets up a PS restriction none flag (Step S510), and terminates this flag setting process for the lifelong drive. On the other hand, in the case where it is determined that PS determination conditions are satisfied, the electronic control unit 10 determines whether the travel distance after the previous determination of whether the PS restriction is carried out or not is confirmed reaches a predetermined threshold (here, k (=Y−X) (km) as shown in FIG. 4A) or longer or not (Step S502). As described above using FIG. 4, for example, the first determination may be carried out when the travel distance is X (km), and the determination after twice may be carried out when it is every k (km) from X (km) (X+k (=Y) (km), X+2k (km), . . . ). In this regard, the present invention is not limited to such a threshold of the travel distance, and a threshold of the travel distance suitable for calculating a distribution ratio of temperature history of the battery 20 may be used as the lifelong drive.

In the case where it is determined that the travel distance after confirmation is shorter than the predetermined threshold, the electronic control unit 10 terminates this flag setting process for the lifelong drive as it is. On the other hand, in the case where it is determined that the travel distance after confirmation is the predetermined threshold or longer, the electronic control unit 10 determines whether a PS restriction large flag is set up or not (Step S503).

In the case where it is determined that the PS restriction large flag is set up, it means a state that output restriction of the battery 20 is required. In this case, as determination of whether a flag concerning the PS restriction is shifted or not, the electronic control unit 10 determines whether the workload difference calculated in the permissible value calculating process is equal to or smaller than Threshold 2 or not (Step S504). In the case where it is determined that workload difference is larger than Threshold 2, the electronic control unit 10 terminates this flag setting process for the lifelong drive while setting up the PS restriction large flag. In the case where it is determined that workload difference is equal to or smaller than Threshold 2, the electronic control unit 10 set up a PS restriction small flag in place of the PS restriction large flag (Step S509), and terminates this flag setting process for the lifelong drive.

On the other hand, In the case where it is determined at Step S503 that a PS restriction large flag is not set up, the electronic control unit 10 subsequently determines whether a PS restriction small flag is set up or not (Step S505). In the case where it is determined that the restriction small flag is set up, the processing flow shifts to Step S507. In the case where it is determined that the PS restriction small flag is not set up, that is, that the PS restriction none flag is set up, and the processing flow shifts to Step S506.

At Step S506, as determination of whether the flag concerning the PS restriction is shifted or not, the electronic control unit 10 determines whether the workload difference is equal to or larger than Threshold 3 or not. In the case where it is determined that the workload difference is equal to or larger than Threshold 3, the electronic control unit 10 sets up the PS restriction small flag in place of the PS restriction none flag (Step S509), and terminates this flag setting process for the lifelong drive. On the other hand, in the case where it is determined that the workload is smaller than Threshold 3, the electronic control unit 10 sets up a PS restriction none flag as it is (Step S510), and terminates this flag setting process for the lifelong drive.

At Step S507, as determination of whether the flag concerning the PS restriction is shifted or not, the electronic control unit 10 determines whether the workload difference is equal to or smaller than Threshold 4 or not. In the case where it is determined that the workload difference is equal to or smaller than Threshold 4, the electronic control unit 10 sets up the PS restriction none flag in place of the PS restriction small flag (Step S510), and terminates this flag setting process for the lifelong drive. On the other hand, in the case where it is determined that workload difference is larger than Threshold 4, the electronic control unit 10 subsequently determines whether the workload difference is equal to or larger than Threshold 1 or not as determination of whether the flag concerning the PS restriction is shifted or not (Step S508).

In the case where it is determined that the workload difference is equal to or larger than Threshold 1, the electronic control unit 10 sets up the PS restriction large flag in place of the PS restriction small flag (Step S511), and terminates this flag setting process for the lifelong drive. On the other hand, in the case where it is determined that the workload difference is smaller than Threshold 1, the electronic control unit 10 terminates this flag setting process for the lifelong drive while setting up the PS restriction small flag.

In this regard, Threshold 1 to Threshold 4 used as determination of whether the flag concerning the PS restriction described above is shifted or not are respectively different from each other, and have a relationship like Threshold 1>Threshold 2>Threshold 3 ($\cong 0$)>Threshold 4. Here, "Threshold 1" is the largest threshold in order to promote increase in power saving of the battery 20 due to the reason why the workload difference further becomes larger in the flag setting process although the PS restriction small flag has already been set up. "Threshold 2" is a threshold smaller than Threshold 1 and larger than Threshold 3 in order to determine whether the power saving can be cut down in accordance with the fact that the workload difference becomes smaller in the flag setting process in a state that the PS restriction large flag has already been set up. "Threshold 3" is a threshold smaller than both Threshold 1 and Threshold 2, and is a value near zero, for example, since it is set up so as to carry out power saving immediately when the workload difference occurs in a state that the output restriction (power saving) of the present embodiment is not carried out. "Threshold 4" is the smallest threshold in order to cancel the output restriction (power saving) due to the reason why the effect by restricting the output is exerted adequately if the workload difference becomes smaller than Threshold 3 to an extent in the flag setting process in a state that the PS restriction small flag has already been set up.

Next, the output value determining process to determine the output value of the battery 20 on the basis of the flag set up in the flag setting process for the lifelong drive will be described. The electronic control unit 10 first determines whether power saving for restricting the output of the battery 20 can be carried out or not on the basis of the driving state of the vehicle 1, temperature of the battery 20 and the like (Step S601). In the case where it is determined that the power saving cannot be carried out, the electronic control unit 10 calls up the normal output values of the battery 20 from the memory 11 (Step S603); determines the normal output values as the output values of the battery 20 (Step S611), and terminates this output value determining process.

On the other hand, In the case where it is determined that the power saving can be carried out, the electronic control unit 10 determines whether the PS restriction none flag is set up or not (Step S602). In the case where it is determined that the PS restriction none flag is set up, the electronic control unit 10 calls up the normal output values of the battery 20 from the memory 11 (Step S603); determines the normal output values as the output values of the battery 20 (Step S611), and terminates this output value determining process.

In the case where it is determined that the PS restriction none flag is not set up, the electronic control unit 10 subsequently determines whether the PS restriction small flag is set up or not (Step S604). In the case where it is determined that the PS restriction small flag is set up, the processing flow shifts to Step S605. On the other hand, in the case where it is determined that the PS restriction small flag is not set up, the processing flow shifts to Step S608.

In the case where it is determined at Step S604 that the PS restriction small flag is set up, the electronic control unit 10 calls up the normal output value of the battery 20 from the memory 11, and calls up the respective setup value S (setup values in the case where the PS restriction is small) corresponding to the instantaneous output, the scramble output and the continuous output acquired in accordance with the workload difference calculated in the permissible value calculating process. The electronic control unit 10 then sets up smaller ones of the normal output and the setup value S in the respective outputs as the instantaneous output, the scramble output and the continuous output (Steps S605 to S607); determines, as the respective output values, the output values thus set up (Step S611); and terminates this output value determining process.

On the other hand, in the case where it is determined at Step S604 that the PS restriction small flag is not set up, it means that the PS restriction large flag is set up. For that reason, the electronic control unit 10 calls up the normal output values of the battery 20 from the memory 11, and calls up the respective setup value L (setup values in the case where the PS restriction is large) corresponding to the instantaneous output, the scramble output and the continuous output acquired in accordance with the workload difference calculated in the permissible value calculating process. The electronic control unit 10 then sets up smaller one of the normal output and the setup value L in each output to the instantaneous output, the scramble output and the continuous output (Steps S608 to S610); determines, as the respective output values, the output values thus set up (Step S611); and terminates this output value determining process.

In this regard, although illustration and explanation thereof is omitted, as well as the first embodiment, a theory reverse to the explanation described above is satisfied at regeneration of the electric motor 3. Namely, in the case where the electric motor 3 is regenerated, electric power generated by the electric motor 3 is supplied to the battery 20. For this reason, by reversing positive and negative of the threshold corresponding to the output of the battery 20, similar control such that charge to the battery 20 is restricted at regeneration of the electric motor 3 can also be carried out. In this manner, the electronic control unit 10 may control the PDU 30 so as to restrict a charge amount to the battery 20 while the battery output restricting section 18 restricts the output of the battery 20.

As explained above, the battery charge/discharge control apparatus according to the present invention includes the temperature sensor 101 for detecting temperature of the battery 20 and the electronic control unit 10, and the electronic control unit 10 includes: the temperature history distribution calculating section 14 for calculating temperature history distribution of the battery 20 since the temperature detecting section 101 starts to detect the temperature; the lifetime workload calculating section 15 for calculating a lifetime workload of the battery 20 on the basis of temperature history distribution calculated by the temperature history distribution calculating section 14; the travel distance detecting section 13 for detecting a travel distance of the vehicle 1; the workload increase rate permissible value calculating section 16 for calculating the permissible value of the workload increase rate on the basis of the lifetime workload calculated by the lifetime workload calculating section 15 and the travel distance detected by the travel distance detecting section 13, the permissible value indicating a workload to increase per unit distance; the accumulated discharge amount detecting section 12 for detecting the accumulated amount of discharge of the battery 20; the comparing section 17 for comparing the actual workload increase rate calculated on the basis of the accumulated amount of discharge of the battery 20 detected by the accumulated discharge amount detecting section 12 and the travel distance detected by the travel distance detecting section 13 with the workload increase rate permissible value calculated by the workload increase rate permissible value calculating section 16; and the battery output restricting section 18 for further restricting the output from the output of the battery 20 restricted in a normal driving mode if necessary by a restricted value based upon a difference between the actual workload increase rate and the permissible value of the workload increase rate in the case where the comparing section 17 determines that the actual workload increase rate is larger than the permissible value of the workload increase rate. Since the battery charge/discharge control apparatus of the present invention is configured in this manner, it is carried out a control of whether the output of the battery 20 is to be restricted in accordance with the temperature history distribution of the battery 20. For that reason, compared with a conventional method, it is possible to simplify the control logic, and it is possible to carry out the lifetime prolonging control for the battery 20 more accurately by setting up an appropriate charge/discharge permissible amount in accordance with temperature change of the battery 20 in the past. Thus, it is possible to ensure lifetime of the battery 20 in all of the vehicles 1 on each of which the similar battery 20 is mounted. Further, in such a usage environment of the battery 20 that the temperature history distribution of the battery 20 falls below the workload increase permissible line, it is possible to continue to use this battery 20 for more than a guaranteed value of the battery 20 (for example, target travel distance Dt).

In this regard, by referring to the temperature history distribution data, the total travel distance data and the like of the battery 20 stored in the memory 11 of the electronic control unit 10, it is possible to confirm a current damage value of the battery 20. Further, by associating such data with the battery 20 that has been exchanged or discarded, it is also possible to determine whether it is reusable or not on the basis of the data of the battery 20.

In the battery charge/discharge control apparatus according to the present invention, the temperature sensor 101 may detect the temperature of the battery 20 every predetermined timing from start to stop of the vehicle 1, and the temperature history distribution calculating section 14 may calculate, as the temperature history distribution, distribution of temperature history detected in a period of time from the start of the vehicle 1 to the latest detection time point by the temperature sensor 101. This makes it possible to determine whether the output of the battery 20 is to be restricted or not on the basis of the temperature history distribution of the battery 20 during one drive cycle.

Alternatively, or in addition thereto, in the battery charge/discharge control apparatus according to the present invention, the temperature sensor 101 may detect the temperature of the battery 20 every predetermined timing from start to stop of the vehicle 1, and the temperature history distribution calculating section 14 may calculate, as the temperature history distribution, distribution of temperature history detected in a period of time from the time when the vehicle 1 has been started for the first time to the latest detection time point by the temperature sensor 101. This makes it possible to determine whether the output of the battery 20 is to be restricted or not on the basis of the temperature history distribution of the battery 20 during the lifelong drive. By utilizing the temperature history distribution of the battery 20 during the lifelong drive, it is possible to inhibit disturbance at a temporary high load on the battery 20, and it is possible to carry out lifetime prolonging control for the battery 20 more appropriately.

In the battery charge/discharge control apparatus according to the present invention, the output of the battery 20 may be controlled so as to be decreased in accordance with elapsed time since the vehicle 1 was started.

In the battery charge/discharge control apparatus according to the present invention, the battery output restricting section 18 may be configured so as to gradually change the output of the battery 20 in accordance with the restricted value.

In the battery charge/discharge control apparatus according to the present invention, the charge to the battery 20 may also be restricted while the battery output restricting section 18 restricts the output of the battery 20. Therefore, it is possible to reduce a load of the battery 20 in a predetermined case even in the case of both an output (discharge) of the battery 20 and an input (charge) of the battery 20.

As described above, although the embodiments of the battery charge/discharge control apparatus according to the present invention have been explained in detail on the basis of the appending drawings, the present invention is not limited to these configurations. Various modifications can be made in a scope of the technical idea described in the following claims, the specification described above and the appending drawings without departing from the spirit and scope of the present invention. In this regard, even any shape, structure or function that is not described directly in the specification and the drawings falls within the technical idea of the present invention so long as the function and the effect of the present invention are achieved. Namely, each component constituting the electronic control unit 10, the electric motor 3 and the transmission 4 that constitute the battery charge/discharge control apparatus can be replaced with any arbitrary component that can achieve the similar function to the corresponding component of the battery charge/discharge control apparatus. Further, arbitrary components may be added thereto.

In this regard, in the first embodiment of the present invention, the case of determining whether the output of the battery 20 is to be restricted or not on the basis of the temperature history distribution of the battery 20 during one DC has been explained. In the second embodiment, the case of determining whether the output of the battery 20 is to be restricted or not on the basis of the temperature history distribution of the battery 20 during lifelong drive has been explained. However, the battery charge/discharge control apparatus according to the present invention may be configured so that these two kinds of controls are carried out in one vehicle 1 at the same time.

In this case, for example, at a temporarily high load of the battery 20 determined on the basis of the temperature history distribution of the battery 20 during one DC, the output restriction of the battery 20 may be set to smaller. At a regularly high load status of the battery 20 determined on the basis of the temperature history distribution of the battery 20 during the lifelong drive, the output restriction of the battery 20 may be set to larger. This makes it possible to set up the output restriction of the battery 20 in accordance with a usage environment of the battery 20 without preventing usability (operability of the vehicle 1) of a driver (user) as much as possible.

What is claimed is:

1. A battery charge/discharge control apparatus for a vehicle capable of driving an electric motor by means of a battery, the apparatus comprising:
   a temperature detecting section for detecting temperature of the battery;
   a temperature history distribution calculating section for calculating temperature history distribution of the battery since the temperature detecting section starts to detect the temperature;
   a lifetime workload calculating section for calculating a lifetime workload of the battery on the basis of the temperature history distribution of the battery calculated by the temperature history distribution calculating section;
   a travel distance detecting section for detecting a travel distance of the vehicle;
   a workload increase rate permissible value calculating section for calculating a permissible value of a workload increase rate on the basis of a lifetime workload of the battery calculated by the lifetime workload calculating section and the travel distance detected by the travel distance detecting section, the permissible value indicating a workload to increase per unit distance;
   an actual workload increase rate calculating section for calculating an actual workload increase rate of the battery;

a comparing section for comparing the permissible value of the workload increase rate calculated by the workload increase rate permissible value calculating section with the actual workload increase rate of the battery calculated by the actual workload increase rate calculating section; and a battery output restricting section for further restricting the output from the output of the battery restricted in a normal driving mode if necessary by a restricted value based upon a difference between the actual workload increase rate and the permissible value of the workload increase rate in the case where the comparing section determines that the actual workload increase rate is larger than the permissible value of the workload increase rate.

2. The battery charge/discharge control apparatus as claimed in claim 1, wherein the temperature detecting section detects the temperature of the battery every predetermined timing from start to stop of the vehicle, and the temperature history distribution calculating section calculates, as the temperature history distribution, distribution of temperature history detected in a period of time from the start of the vehicle to the latest detection time point by the temperature detecting section.

3. The battery charge/discharge control apparatus as claimed in claim 1, wherein the temperature detecting section detects the temperature of the battery every predetermined timing from start to stop of the vehicle, and the temperature history distribution calculating section calculates, as the temperature history distribution, distribution of temperature history detected in a period of time from the time when the vehicle has been started for the first time to the latest detection time point by the temperature detecting section.

4. The battery charge/discharge control apparatus as claimed in claim 1, wherein the output of the battery is controlled so as to be decreased in accordance with elapsed time since the vehicle has been started.

5. The battery charge/discharge control apparatus as claimed in claim 1, wherein the battery output restricting section gradually changes the output of the battery in accordance with the restricted value.

6. The battery charge/discharge control apparatus as claimed in claim 1, wherein charge to the battery is also restricted while the battery output restricting section restricts the output of the battery.

7. The battery charge/discharge control apparatus as claimed in claim 2, wherein the output of the battery is controlled so as to be decreased in accordance with elapsed time since the vehicle has been started.

8. The battery charge/discharge control apparatus as claimed in claim 2, wherein the battery output restricting section gradually changes the output of the battery in accordance with the restricted value.

9. The battery charge/discharge control apparatus as claimed in claim 2, wherein charge to the battery is also restricted while the battery output restricting section restricts the output of the battery.

10. The battery charge/discharge control apparatus as claimed in claim 3, wherein the output of the battery is controlled so as to be decreased in accordance with elapsed time since the vehicle has been started.

11. The battery charge/discharge control apparatus as claimed in claim 3, wherein the battery output restricting section gradually changes the output of the battery in accordance with the restricted value.

12. The battery charge/discharge control apparatus as claimed in claim 3, wherein charge to the battery is also restricted while the battery output restricting section restricts the output of the battery.

* * * * *